United States Patent
Kwon

(10) Patent No.: US 6,661,710 B2
(45) Date of Patent: Dec. 9, 2003

(54) NONVOLATILE FLASH MEMORY DEVICE USABLE AS BOOT-UP MEMORY IN A DIGITAL INFORMATION PROCESSING SYSTEM AND METHOD OF OPERATING THE SAME

(75) Inventor: Suk-Chun Kwon, Kyunggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/154,040

(22) Filed: May 21, 2002

(65) Prior Publication Data
US 2002/0176279 A1 Nov. 28, 2002

(30) Foreign Application Priority Data
May 23, 2001 (KR) ........................................ 2001-28368

(51) Int. Cl.[7] .............................................. G11C 16/04
(52) U.S. Cl. ............................... 365/185.24; 365/189.04
(58) Field of Search ....................... 365/185.24, 189.05, 365/189.04, 225.7, 226, 241, 233.5

(56) References Cited

U.S. PATENT DOCUMENTS

| | | | | |
|---|---|---|---|---|
| 5,283,792 A | * | 2/1994 | Davies et al. .................. | 714/22 |
| 5,577,195 A | * | 11/1996 | Gochi ......................... | 714/22 |
| 5,881,012 A | * | 3/1999 | Kawasaki et al. .......... | 365/226 |

* cited by examiner

Primary Examiner—Thong Le
(74) Attorney, Agent, or Firm—Marger Johnson & McCollom, P.C.

(57) ABSTRACT

A flash memory device is provided, which may perform a read operation by itself without receipt of any command and/or address. The flash memory device may be used as a boot-up memory in a system. Additionally, it may be operable to also carry out normal write/read operations that may require command, address and control data from sources external the flash memory. During a system power-up, as the supply voltage increases, the flash memory device detects whether it is to be used as a boot-up memory in a system. The flash memory may then enter suitable operation modes in accordance with the detected results.

39 Claims, 8 Drawing Sheets

NONVOLATILE FLASH MEMORY DEVICE USABLE AS BOOT-UP MEMORY IN A DIGITAL INFORMATION PROCESSING SYSTEM AND METHOD OF OPERATING THE SAME

CROSS REFERENCE TO RELATED APPLICATIONS

This application claims priority from Korean Priority Document No. 2001-28368, filed on May 23, 2001 with the Korean Industrial Property Office, which document is hereby incorporated by reference.

BACKGROUND OF THE INVENTION

1. Field of the Invention

The present invention relates to semiconductor memory devices and, more particularly, to a flash memory that is usable as a boot-up memory component in a digital information processing system such as a computer.

2. Related Art of the Invention

Nonvolatile flash memory devices such as electrically erasable and programmable read only memories (EEPROMs) are used in a variety of applications including computers, integrated circuit (IC) cards, digital cameras, camcorders, communication terminals, communication equipment, medical equipment, and automobile control systems.

NAND-type flash memories are used for mass storage because of integration advantages over NOR-type flash memories. In this regard, the NAND-type flash memories have a reduced number of pins, high bulk data transfer rate, and identical package pin configuration for high upgradeability.

In a NAND-type flash memory, a plurality of input/output (I/O) pins serve as a common port for command input, address input, and data input/output. To indicate type of information (and data) command, address to be provided is via the input/output pins. A flash memory may use several control signals or strobe signals. For example, these signals may include a chip enable signal $\overline{CE}$, a command latch enable signal CLE, an address latch enable signal ALE, a write enable signal $\overline{WE}$, a read enable signal $\overline{RE}$, a spare area enable signal $\overline{SE}$, and a read/busy signal R/B.

In a personal computer system, a flash memory may be used as a system boot-up memory. During power-up, the flash memory may provide Basic Input Output System (BIOS) information which may be read from the flash memory and written into a main system memory (e.g., DRAM). During the power-up, it is necessary to provide the flash memory with control or strobe signals prior to command, address, and data inputs. This results in more complex boot-up interfacing operation than that required when using conventional mask ROMs, EPROMs, or EEPROMs.

Accordingly, a need remains for a flash memory adapted as a boot-up memory.

SUMMARY OF THE INVENTION

An object of the invention is to provide a flash memory that overcomes the disadvantages associated with prior art flash memories.

Another object of the present invention is to provide a flash memory device adapted as a boot-up memory in a digital information processing system.

Yet another object of the invention is to provide a flash memory device that has a simple bus interface.

Yet another object of the invention is to provide a flash memory device capable of reading out boot-up data during power-up without application of an external address and an external command.

Yet another object of the invention is to provide a flash memory device installed in a digital information processing system that is capable of reducing system power consumption.

Yet another object of the invention is to provide an application-specific flash memory adapted as a boot-up memory or other storage memory in a digital information processing system.

Yet another object of the invention is to provide a method of operating a flash memory device with various modes of operation.

According to an aspect of the present invention, a flash memory device is provided, which is used as a boot-up memory in a digital information processing system and is capable of reducing power consumption of the entire system as much as possible. The flash memory device can selectively be used as a boot-up memory or a normal memory for storing information except information associated with the boot-up in a digital information processing system.

The flash memory device includes a memory cell array having a plurality of nonvolatile memory cells arranged in rows and columns, and a power detecting circuit for generating a first detection signal when a power supply voltage is lower than a predetermined detection voltage. The flash memory device further includes an address generating means for internally generating an address in response to a first detection signal, a read circuit for reading data from the memory cell array in response to the internally generated address, and a control circuit for generating a control signal to selectively control activation of the read circuit in response to device information when the power supply voltage is lower than the predetermined detection voltage. The control circuit has a storage circuit for storing the device information. The device information includes information about whether or not the flash memory is used as a boot-up memory in a digital information processing system.

Only when the flash memory device is used as a boot-up memory in a system, i.e., during a boot-up period (preferably, a power-on period) of the system, the read circuit is activated in accordance with the device information such that the flash memory device can perform a boot-up data sensing operation. That is, when the flash memory device is not used as a boot-up memory, the read initiate circuit is deactivated depending on the device information during a boot-up period of the system, thereby preventing the boot-up data sensing operation of the flash memory device.

The storage circuit may be a pad formed on the flash memory device. In this case, the pad is selectively coupled to one of first and second setting voltages. Also the pad may be one of pads for interfacing the flash memory device with external devices, or one of bonding pads. One of the first and second device setting voltages is a logic zero (0) voltage, and the other is a logic one (1) voltage.

Also the storage circuit may be a fuse circuit having at least one fuse. In this case, the fuse circuit selectively supplies one of the first and second device setting voltages depending on a coupling state of the at least one fuse.

The detection voltage is an internal supply voltage. In this case, the internal supply voltage is lower than a normal power supply voltage. Alternatively, the detection voltage is lower than the power supply voltage and is higher than the internal supply voltage. Alternatively, the detection voltage may be lower than the internal supply voltage.

The address generating means preferably has an address buffer for storing an externally applied address.

As described above, only when the flash memory device is used as a boot-up memory in a system, a read circuit is activated such that the flash memory device can perform a boot-up data sensing operation thereof. On the other hand, when the flash memory device is not used as the boot-up memory, the read circuit is deactivated, and thus the flash memory device does not perform the boot-up data sense and amplify operation thereof. This prevents the flash memory device from performing unnecessary operation thereof during a boot-up period of a system, thereby reducing power consumption of the system.

In a preferred embodiment, the read circuit includes a row selecting circuit for selecting one or more rows corresponding to a row address of the internally generated address, a column selecting circuit for selecting one or more columns corresponding to a column address of the internally generated address, a page buffer for sensing data stored in memory cells of the selected columns, a read initiate circuit for generating a second detection signal when the power supply voltage reaches the predetermined detection voltage and the control signal is active, and a read controller for controlling a sensing operation of the page buffer in response to the second detection signal. When the power supply voltage is lower than the predetermined detection voltage, activation of the read initiate circuit is selectively controlled by the control signal from the control circuit. Only when the flash memory device according to this embodiment is used as a boot-up memory in a system, a read initiate circuit is activated depending on device information such that the flash memory device can perform a boot-up data sensing operation thereof. On the other hand, when the flash memory device is not used as a boot-up memory in a system, the read initiate circuit is deactivated according to the device information such that the flash memory device does not perform the boot-up data sensing operation thereof.

In another preferred embodiment, when the power supply voltage is lower than the predetermined detection voltage, activation of the power supply voltage detection circuit is selectively controlled by the control signal from the control circuit that operates based upon the device information. Only when the flash memory device according to this embodiment is used as a boot-up memory in a system, the read initiate circuit is activated according to device information, and thus the flash memory device can perform a boot-up data sensing operation thereof. On the other hand, when the flash memory device is not used as the boot-up memory, the read initiate circuit is deactivated according to the device information, and thus the flash memory device does not perform the boot-up data sensing operation thereof.

According to another aspect of the present invention, there is provided a method of operating a flash memory device installed in a system when the system begins to be supplied with a power supply voltage. It is determined whether the flash memory device itself is set as a boot-up memory of a system during a power-on period of the system. If so, the flash memory device reads out boot-up data stored therein during the power-on period. If not, the flash memory device enters a ready mode wherein its normal write/read operations can be performed, after the power-on period.

In the determination step, the flash memory device reads device information indicating whether or not the memory device is set as the boot-up memory of the system when a power supply voltage is lower than a predetermined detection voltage. In the boot-up data read step, an address is internally generated within the flash memory device when the device information indicates that the memory device is set as the boot-up memory of the system, and the boot-up data is sensed depending on the internally generated address when the power supply voltage reaches the predetermined detection voltage. On the other hand, when the device information indicates that the memory device is not set as the boot-up memory of the system, the boot-up data sensing is prevented.

As summarized above, only when the flash memory device is used as a boot-up memory in a system, the flash memory device can perform a boot-up data sensing operation thereof. In contrast, when the flash memory device is not used as the boot-up memory, the flash memory device does not perform the boot-up data sensing operation thereof. This prevents the flash memory device from performing unnecessary operation thereof during a boot-up period of a system, thereby reducing power consumption of the system.

BRIEF DESCRIPTION OF THE DRAWINGS

The present invention will now be described more fully with reference to the accompanying drawings. Typically, reference numerals will refer to like elements.

DESCRIPTION OF THE PREFERRED EMBODIMENT

In the following description, readily established circuits of the exemplary embodiments may be disclosed in simplified form (e.g., block diagram style) to avoid obscuring an essence of the embodiments with excess detail. Likewise, to aid a clear and precise disclosure, the description of their operations—e.g., timing considerations and the like—may similarly be simplified when person of ordinary skill in this art can readily understand their operations by way of the drawings and disclosure.

Figure 1:
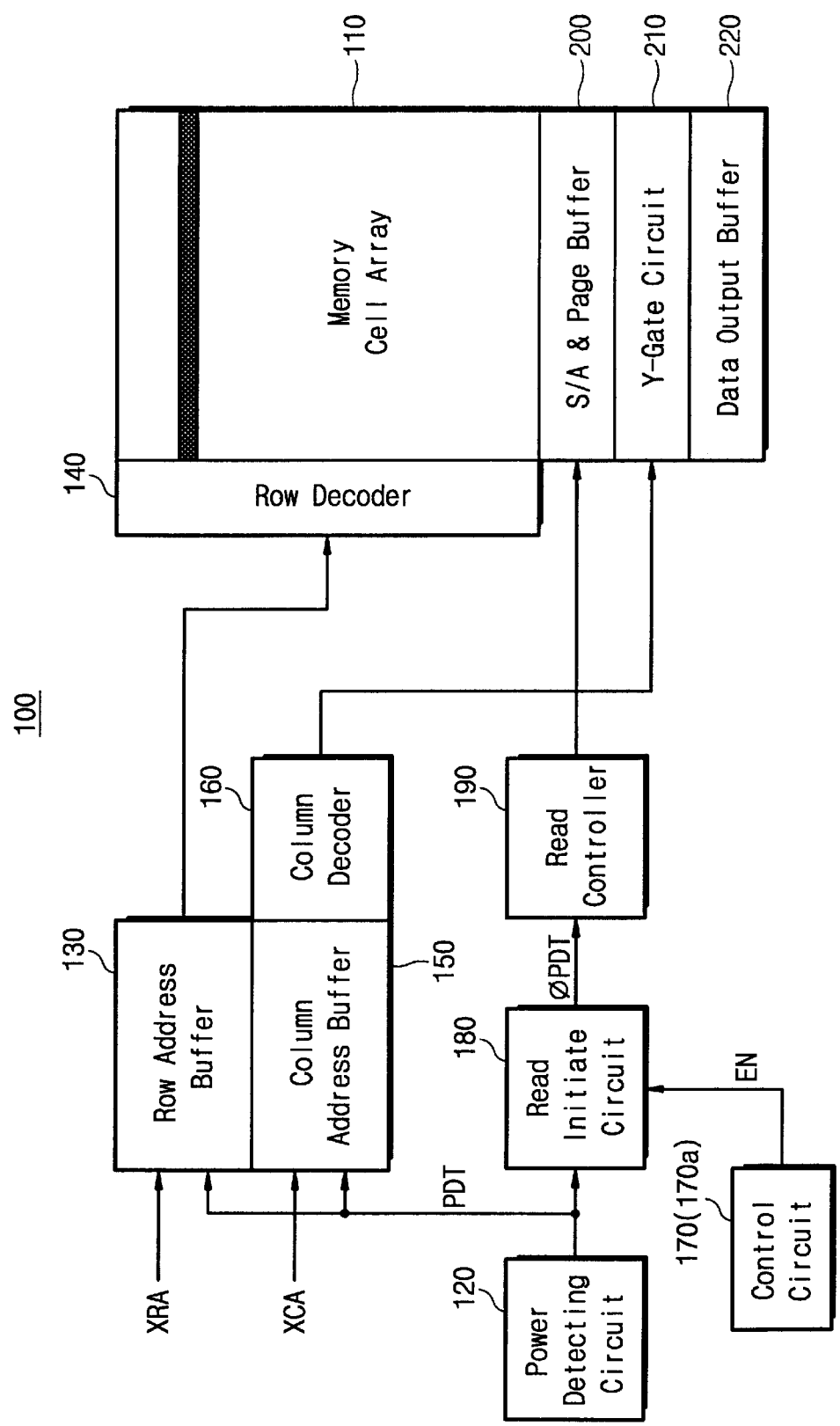
FIG. 1 is a block diagram of a nonvolatile flash memory device according to an embodiment of the present invention.

FIG. 1 is a block diagram of an embodiment of a nonvolatile flash memory device according to the present invention. Referring to FIG. 1, a flash memory device 100 may be used as a boot-up memory in a digital information processing system such as a computer or the like. The flash memory device 100 alternatively may be used as a storage memory for storing information other than system boot-up information. The flash memory device 100 might be adapted as both the boot-up and storage memory.

The flash memory 100 includes array 110 of nonvolatile memory cells (not shown) arranged in rows and columns. A power detecting circuit 120 may generate a detection signal PDT when a power supply voltage VDD is lower than a predetermined detection voltage Vdet. A row address buffer 130 internally generates a row address responsive to the detection signal PDT. A column address buffer 150 internally generates a column address responsive to the detection signal PDT. The addresses internally generated from the address buffers 130 and 150 designate a specific page (preferably, the first or last page) of the memory cell array. It will be understood to those skilled in the art that a plurality of addresses designating a plurality of continuous pages can sequentially be generated based on the addresses output from the buffers 130 and 150.

In addition, the row and column address buffers 130 and 150 temporarily buffer external row and column addresses XRA and XCA, respectively. A row address decoder (or X-decoder) 140 selects at least one row of the memory cell array 110 by decoding the external row address XRA. A column address decoder (or Y-decoder) 160 selects at least one column of the memory cell array 110 by decoding the external column address XCA. The row address buffer 130 and the row address decoder 140 may act as a row select circuit to select one or more rows corresponding to the internally generated row address or the externally provided row address XRA. Similarly, the column address buffer 150 and the column address decoder 160 may act as a column select circuit to select one or more columns corresponding to the internally generated column address or the externally provided column address XCA.

A control circuit 170 or 170a may generate a control signal EN responsive to device information when the power supply voltage VDD is lower than the detection voltage Vdet. A read initiate circuit 180 may generate a detection signal ΦPDT in response to both the detection signal PDT and the control signal EN. In this embodiment, the output signal ΦPDT of the read initiate circuit 180 may be activated when the power supply voltage VDD reaches the detection voltage Vdet and the control signal EN is active.

A read controller 190 generates a control signal for controlling a read operation of a sense amplifier and page buffer (hereinafter refer to as 'page buffer') 200 when the detection signal ΦPDT is activated. The page buffer 200 senses data stored in selected memory cells in response to the output control signal of the read controller 190 and holds the sensed data. A column gate circuit (or Y-gate circuit) 210 transfers the data held in the page buffer 200 to a data output buffer 220 in response to a column address. A data output buffer 220 provides input/output pads or pins (not shown) with the data provided from the page buffer 220 through the column gate circuit 210.

In a particular embodiment, the control circuit 170 or 170a has a storage circuit (not shown) for storing device information that may include information to designate whether the flash memory device 100 is to be used as a boot-up memory. The control circuit 170 or 170a may control the activation of the read initiate circuit 180 depending on the device information. In one example, when the device information indicates that the flash memory device 100 is to be used as a boot-up memory, the control circuit 170 or 170a may enable activation the read initiate circuit 180 during boot-up when data may be read as the system powers-on this may allow a boot-up data sensing operation of the memory device 100.

On the other hand, when the device information indicates that the flash memory device 100 is not to be used as a boot-up memory, the control circuit 170 or 170a may inactivate the read initiate circuit 180 to prevent the boot-up data sense operation. In this case, the flash memory device 100 may enter a mode of operation wherein the device 100 can perform its write/read operations.

As described above, the flash memory device 100 may be selectively operable as either a boot-up memory or a normal memory. When the flash memory device 100 is used as a normal memory, its power consumption within the system can be reduced during power-up given that it is not being read during the system boot-up.

Figure 2:
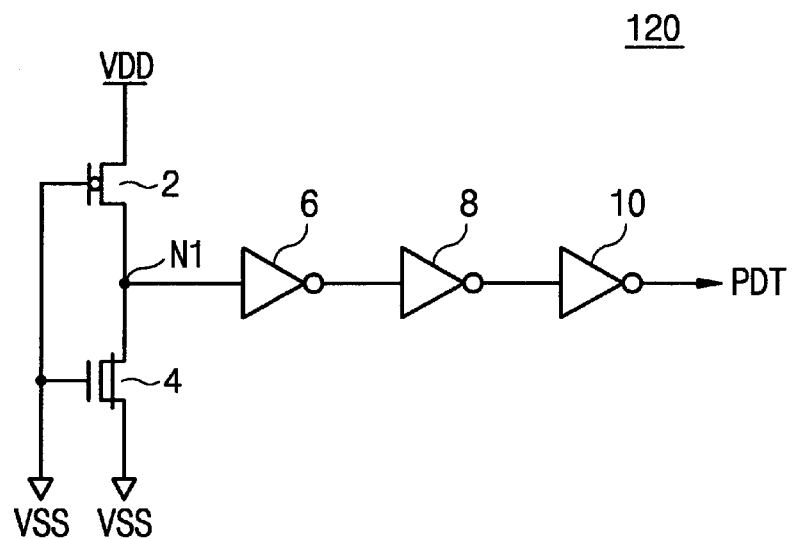
FIG. 2 is a detailed circuit diagram of the power detecting circuit shown in FIG. 1.

FIG. 2 illustrates a detailed circuit diagram of the power detecting circuit 120 shown in FIG. 1. Referring to FIG. 2, power detecting circuit 120 includes an enhancement-type PMOS transistor 2, and a depletion-type NMOS transistor 4 coupled with their channel in series with each other between power supply voltage VDD and ground. A gate electrodes (or control electrode) of the PMOS transistor 2 and NMOS transistor are coupled to a ground VSS. The gateable channel of PMOS transistor 2 is coupled to VDD while the gateable channel the NMOS transistor 4 is coupled to the ground. The inverters 6, 8, and 10 are coupled in series to receive a signal from node N1 where the drains of transistors 2 and 4 are joined. A trigger voltage of the inverter 6 is set to be identical with the detection voltage Vdet. In other words, a threshold voltage $V_T$ of an NMOS pull-down transistor (not shown) constituting the CMOS inverter 6 and a shut-off voltage $V_S$ of a PMOS pull-up transistor (not shown) constituting the inverter 6 may be set to be substantially identical with the level of the detection voltage Vdet. An output of the inverter 10 provides a detection signal PDT.

The depletion-type NMOS transistor 4 of the power detecting circuit 120 serves substantially as current-restrictive resistor means to allow only a constant current to flow toward the ground voltage VSS.

When supply voltage VDD is interrupted, i.e., when the power supply voltage VDD is substantially 0V, voltage $V_{N1}$ of the node N1 is identical with the ground voltage VSS. When the power supply voltage VDD is gradually increased, the voltage $V_{N1}$ will initially follow the level of the power supply voltage VDD. Also, the voltages of output terminals of the respective inverters 6, 8, and 10 will initially follow the increasing level of power supply voltage VDD. Therefore, the voltage level of the detection signal PDT will initially follow the level of power supply voltage VDD. But, when the level of the power supply voltage VDD reaches the detection level Vdet, the inverter 6 is triggered and its output state may switch to a logic zero (or low level) voltage. As a result, the level of detection signal PDT will transition to a low level (see FIG. 7).

Figure 3:
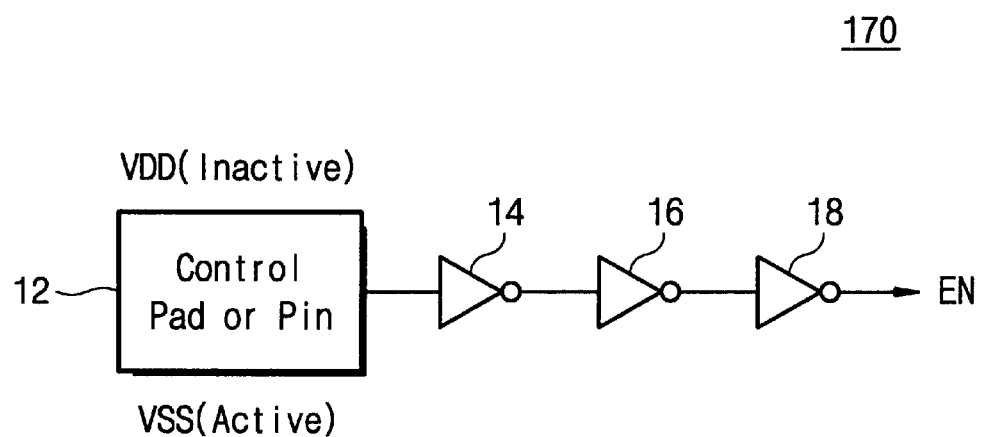
FIG. 3 is a circuit diagram of an embodiment of the control circuit shown in FIG. 1.

FIG. 3 illustrates a circuit diagram of the control circuit 170 for an embodiment of FIG. 1. Referring to FIG. 3, the control circuit 170 includes a control pad (or control pin) 12 and a plurality of (preferably, an odd number of) CMOS inverters 14, 16, and 18. The inverters may be connected in series with control pad 12. The last inverter 18 may provide a control signal EN.

The first inverter 14 is coupled to receive the signal of the control pad 12 voltage of the signal level of control pad 12 may establish the operation mode of the flash memory. For example, the pad 12 may be set to a logic zero voltage (preferably, a ground voltage VSS) when the flash memory device (as shown in FIG. 1) is to be used as a boot-up memory. In such mode, the enable control signal EN becomes active or high.

On the other hand, when the flash memory device 100 is not to be used as a boot-up memory, the control pad 12 may be couple to a second device setting voltage for example a logic one voltage (such as, the power supply voltage VDD). In this case, the enable control signal EN goes inactive or low.

Although a configuration of the control signal 170 has been described with one pad, the control circuit 170 in accordance with alternative embodiments may have two or more pads. For such embodiments, control circuit 170 may include a plurality of pads and its circuit elements may be modified to establish whether the flash memory device 100 may be used only as a boot-up memory, as a normal memory, or as both a boot-up memory and a normal memory. Additionally, it may be noted that the usage of memory device 100 may be changed even though the device 100 has already been installed in a system.

Figure 4:
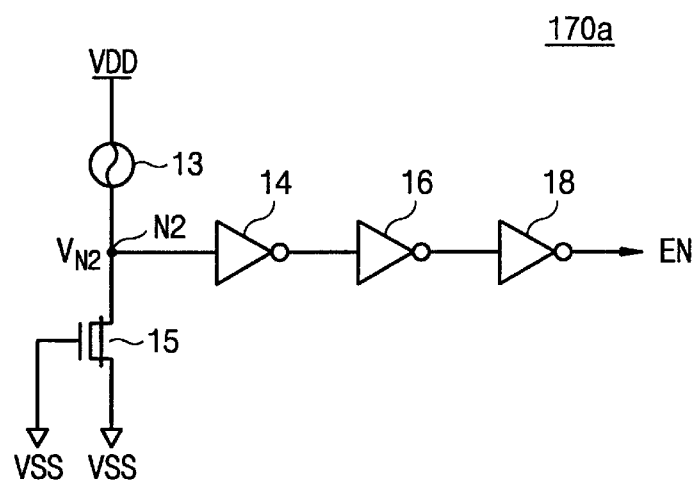
FIG. 4 is a circuit diagram of another embodiment of the control circuit shown in FIG. 1.

FIG. 4 illustrates a circuit diagram of another embodiment 170*a* of the control circuit of FIG. 1. For this embodiment, the control circuit 170*a* has the same configuration as the control circuit 170 of FIG. 3, except that the pad 12 of the control circuit 170 may be replaced by a fuse 13 and a depletion-type NMOS transistor 15.

One end of the gateable channel of transistor 15 is coupled to fuse 13 to receive biasing of supply voltage VDD through the fuse 13. The other end of the gateable channel of transistor 15 is coupled to the ground or voltage VSS. A gate electrode of the transistor 15 is coupled to the ground voltage VSS. In the control circuit 170*a*, the transistor 15 acts a current-restrictive resistor means for allowing a constant current to flow toward the ground voltage VSS.

If the flash memory device 100 is to be used as a boot-up memory device, then fuse 13 of the control circuit 170*a* should be cut. In such a case, a voltage $V_{N2}$ of node N2 will be equal to ground voltage VSS (a first device setting voltage or a logic zero voltage), and the control signal EN will become active high via inverters 14–18.

On the other hand, of the flash memory device 100 of the invention is to be used as a normal memory device the fuse 13 may be left intact. In this embodiment, voltage $V_{N2}$ of the node N2 will be pulled up to the power supply voltage VDD (a second device setting voltage or a logic on voltage), so that the control signal EN will become active high.

Although an embodiment of the control circuit 170*a* has been described with one fuse it is understood that the control circuit 170*a* might alternatively comprise two or more fuses. For such exemplary alternative embodiments, the control circuit 170*a* may establish that flash memory device 100 may be selectably operable not only as a boot-up memory or normal memory, but that it might also be operable as both a boot-up memory and a normal memory. In further exemplary embodiments, such programmable elements may be programmed to change the use of the flash memory device 100 after it has, perhaps, already been installed in a system.

As described above, when the flash memory device 100 is used as a boot-up memory in a system such as a computer, either the pad or pin 12 of the control circuit 170 (shown in FIG. 3) may be coupled to the ground voltage VSS or a fuse 13 of an alternative control circuit 170*a* (shown in FIG. 4) is cut. On the other hand, when the flash memory device 100 is not to be used as a boot-up memory, either the pad or pin 12 of the control circuit 170 is coupled to the power supply voltage VDD or, for the alternative embodiment, the fuse 13 of the control circuit 170*a* is left intact. The coupling of the pad 12 to either the power supply voltage VDD or the ground voltage, VSS or the configuration state of the fuse 13 may establish the device configuration information to indicate whether or not the flash memory device 100 may be used as a boot-up memory in a system. Or the alternative control circuits 170 or 170*a* may also store such device configuration information. For these embodiments, the pad 12 coupled to either the power supply voltage VDD or the ground voltage VSS (as shown in FIG. 3), or the fuse 13 (as shown in FIG. 4) may serve as programmable storage means to store device information for establishing operating modes of the flash memory device 100.

Figure 5:
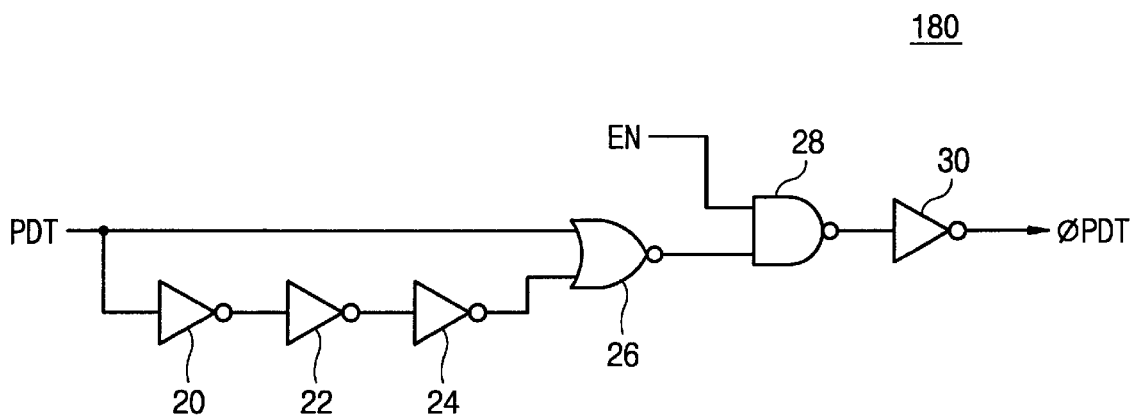
FIG. 5 is a circuit diagram of the read initiate circuit shown in FIG. 1.

FIG. 5 illustrates circuit diagram of a read initiate circuit 180 an embodiment as shown in FIG. 1. The read initiate circuit 180 includes a short pulse generating circuit and a transfer gate circuit. The short pulse generating circuit may comprise a plurality of (in this embodiment, odd-numbered) CMOS inverters 20, 22, and 24, and a CMOS NOR gate 26. The transfer gate circuit may comprise a CMOS NAND gate 28 and a CMOS inverter 30. One input terminal of NOR gate 26 is to receive the detection signal PDT directly from the power detecting circuit 120, and the other input is to receive the signal PDT via inverters 20, 22, and 24. Threshold voltages $V_t$ of NMOS pull-down transistors (not shown) and shut-off voltages $V_s$ of PMOS pull-down transistors (not shown) constituting the inverters 22, 24, and 26 may be set to the same level as the detection voltage $V_{det}$. Also, threshold voltages $V_t$ of NMOS pull-down transistors (not shown) of the input of the 2-input NOR gate 26 may be set to the same level as that of the detection voltage $V_{det}$. Similarly, threshold voltages $V_t$ of PMOS transistors (not shown) as associated with the inputs of the NOR gate 26 may be set such that the PMOS transistors of the NOR gate 26 may be shut off when the power supply voltage VDD reaches the detection voltage $V_{det}$. An output of the NOR gate 26 may drive one input terminal of the NAND gate 28. The control signal EN from the control circuit 170 and 170*a* may drive the other input terminal of the NAND gate 28. Inverter 30 outputs a detection signal ΦPDT.

NOR gate 26 may generate a pulse signal, which may be activated when the detection signal PDT reaches the detection voltage $V_{det}$ and may last for a predetermined duration. In a particular embodiment, when the detection signal ΦPDT transitions low, i.e., which may be effected by the power supply voltage VDD reaching the detection voltage $V_{det}$, NMOS pull-up transistors in the NOR gate 26 may turn-on. Thus the output of NOR gate 26 may transition high. After the lapse of a predetermined time $T_d$, which may be determined by the inverters 20, 22, and 24, an output of NOR gate 26 returns to a low level (see FIG. 7).

As described above, the short pulse generating circuit may generate a pulse triggered by a transition of the detection signal PDT and last a predetermined duration which may be established by the propagation delays of the inverters. When the control signal EN from the control circuit 28 is held high, the pulse signal from NOR gate 26 may be output through NAND gate 28 and the inverter 30 as the detected signal. In other words, the transfer gate circuit 28, 30 may generate the pulse ΦPDT only while the control signal EN is held high.

In certain embodiments, the flash memory device may be used as a normal memory alternatively to a boot-up memory. In further embodiments, it may be used as both. That is, the flash memory device of such embodiment may perform a read operation during an initial boot up function without input of a command and associated address information. And/or, alternatively, it can perform normal write/read operations after having completed such boot-up function. During the normal write/read operations, the flash memory device should receive a command and associated address information, and data if necessary, from an external source. Such functions of the flash memory device may be selectively set by a user. Therefore, the flash memory device of the invention detects the configuration information as the power supply voltage VDD ramps up to determine whether it is to be used as a boot-up memory during power-up, and it may enter an appropriate selected mode of operation depending on the determined configuration information.

Figure 6:
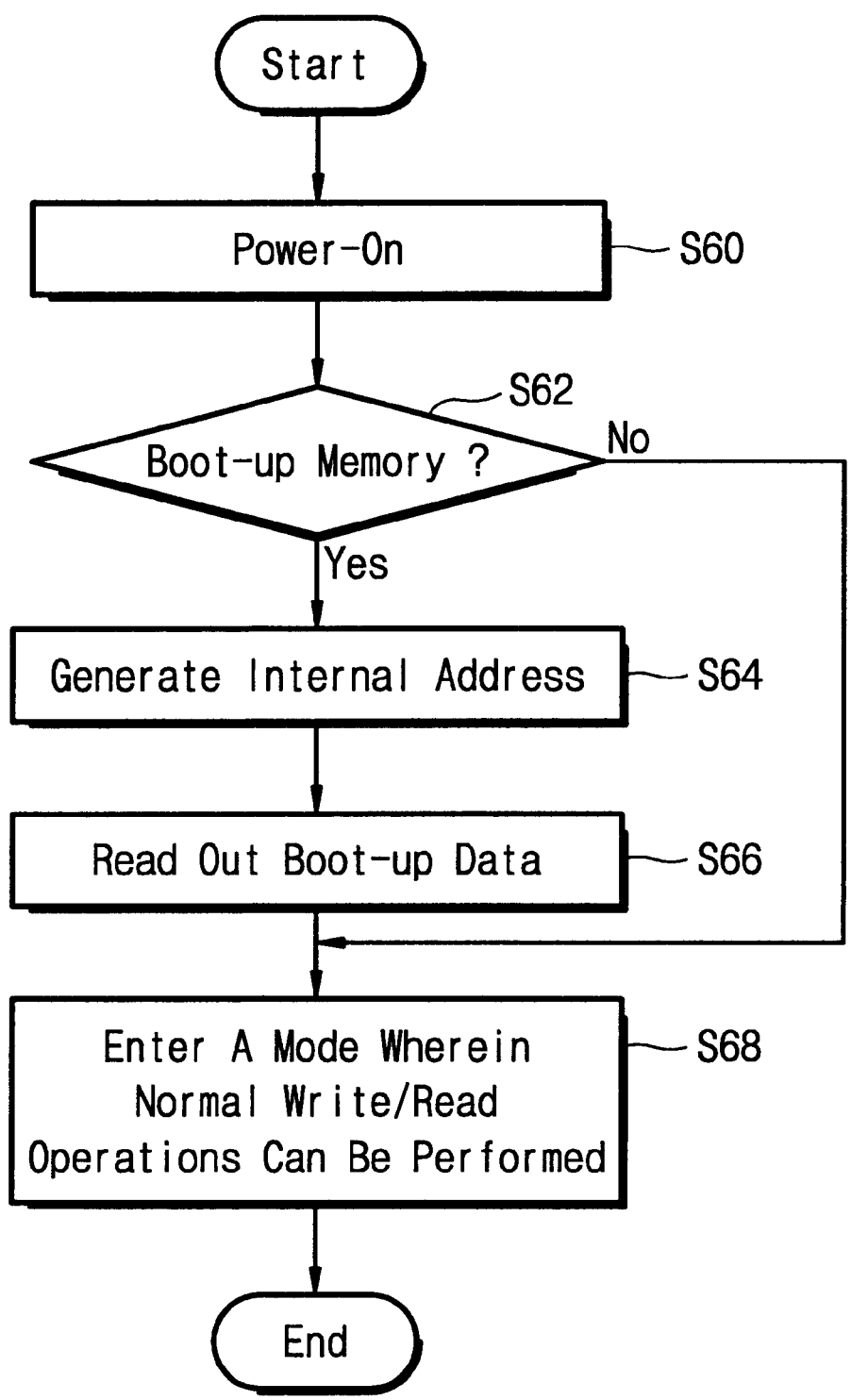
FIG. 6 is a flowchart of a method of operating a nonvolatile flash memory device according to an embodiment of the present invention.

During operation of the flash memory device, according to an embodiment referencing FIG. 6, when a system is powered on, the power supply voltage VDD may begin to ramp-up. The flash memory may then determine 62 whether it is to be used as a boot-up memory. In making this determination, the flash memory may read device information which may indicate whether the memory is to be a boot-up memory while the power supply voltage VDD is lower than a predetermined reference Vdet.

In subsequent steps 64 and 66, the flash memory device may be operable as a boot-up memory during a system power-on to read-out boot-up data stored. In a particular embodiment, the flash memory device may generate 64 an address internally. And, when the power supply voltage VDD to the memory reaches the predetermined detection voltage Vdet, the flash memory device may sense the boot-up data by means of the internally generated address. After read-out and sensing of the boot-up data, the flash memory device may enter 68 a so-called stand-by mode of operation. In the stand-by mode, after the power-on duration, the flash memory device can perform normal write/read operations.

If the flash memory device is not to be set as a boot-up memory, the flash memory may enter the stand-by mode 68 after the power-on duration without performing any read-out operations for a system boot-up. That is, when the device information indicates that the flash memory device is not to be set as a boot-up memory, operation of the flash memory device may be inhibited during the power-up. Therefore, power consumption by the flash memory device may be reduced by eliminating unnecessary operations during the power-up duration.

Figure 7:
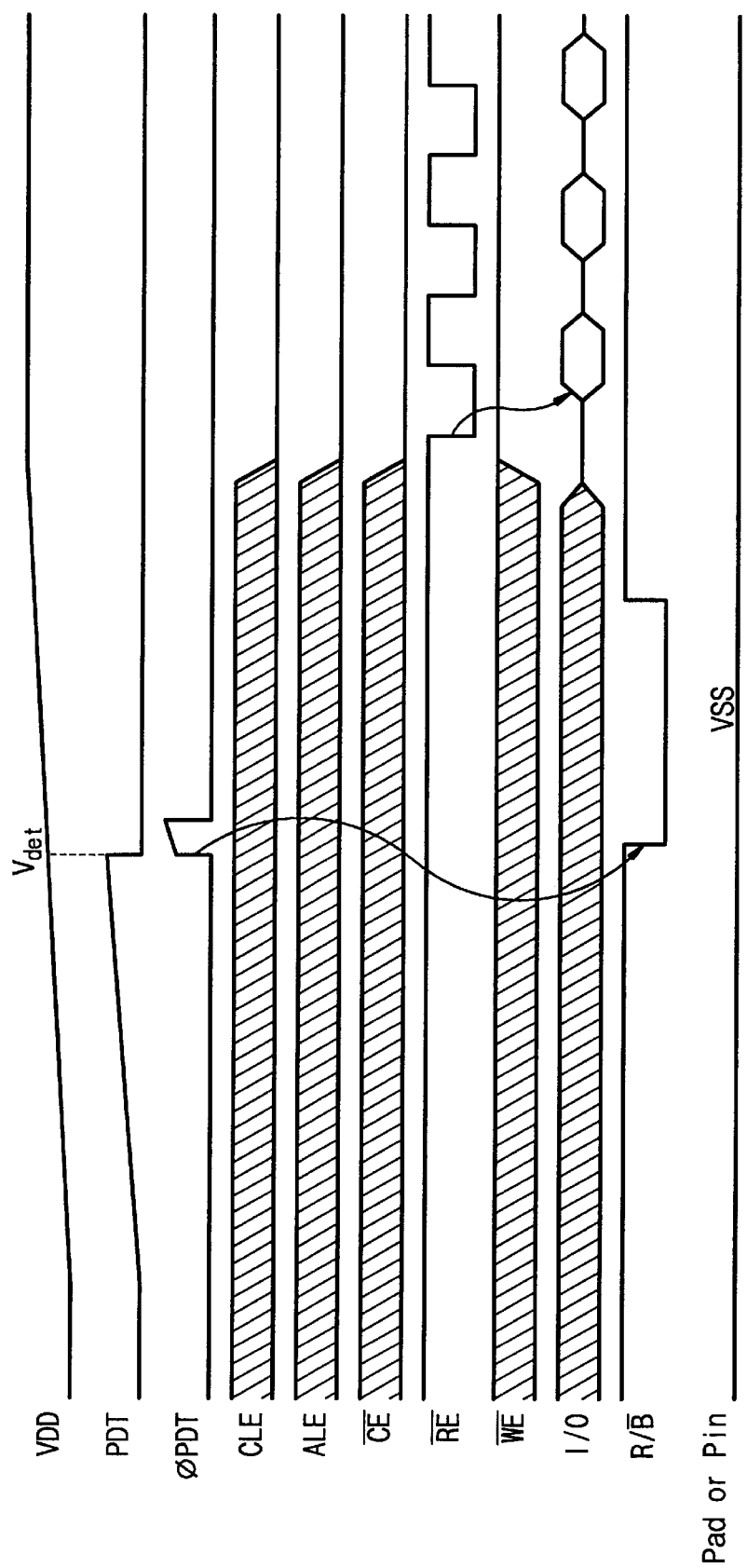
FIG. 7 is a timing diagram of the memory device shown in FIG. 1, adapted as a boot-up memory.
Figure 8:
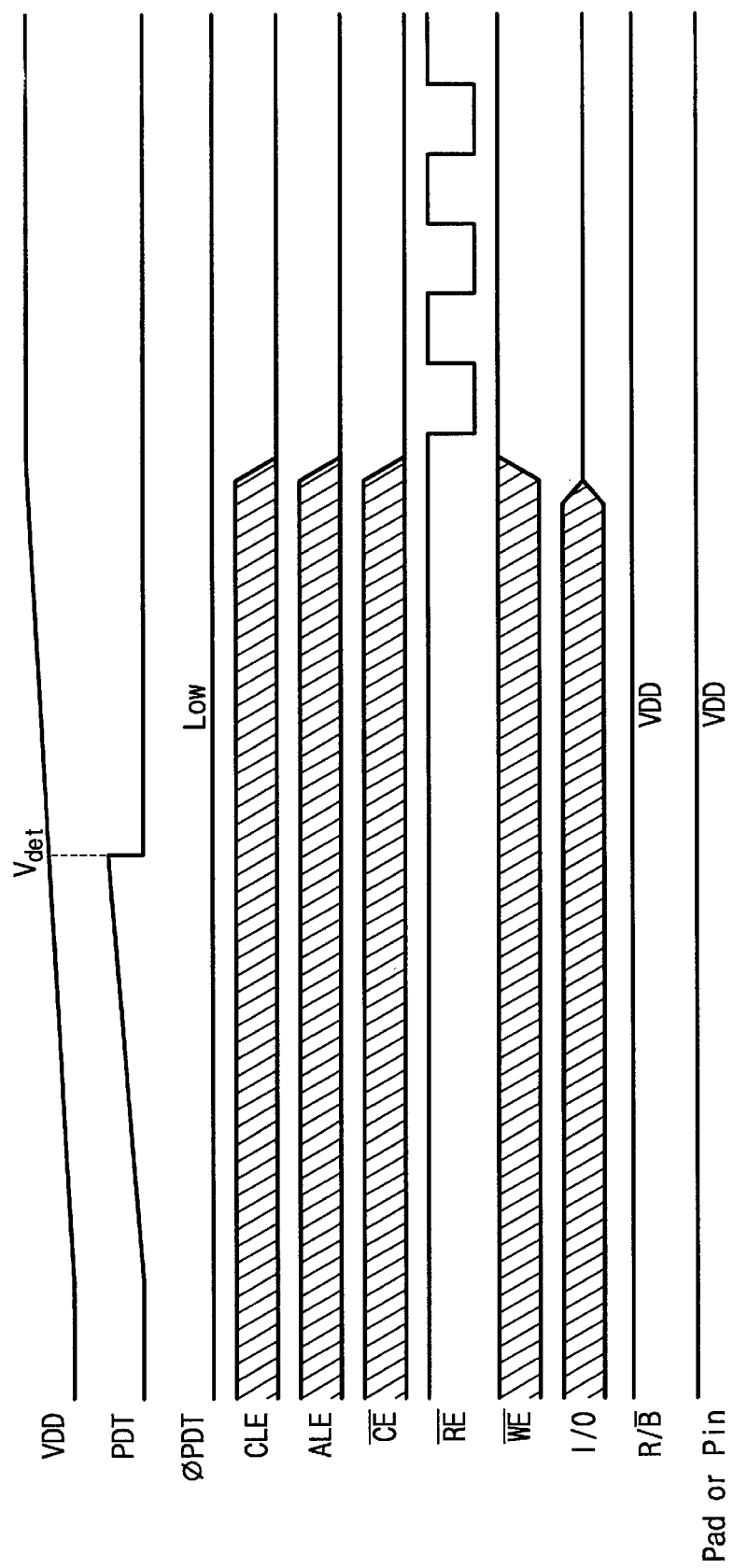
FIG. 8 is a timing diagram of a memory device shown in FIG. 1, adapted as a storage memory.

FIG. 7 is a timing diagram showing signals of a flash memory device during a system boot-up. FIG. 8 is a timing diagram showing signals of a flash memory device during normal memory operation.

Operations of the flash memory device 100 such as that shown in FIG. 1, may now be described with reference to FIGS. 1–8.

If the flash memory device 100 is to be used as a boot-up memory, the pad or pin 12 of control circuit 170, such as that shown in FIG. 3 maybe coupled to VSS. For alternative control circuits, e.g., a fuse 13 may be cut (see FIG. 4).

Referring to FIG. 7, when power supply voltage VDD starts to rise during a system power-on a voltage level of the power detection signal PDT (as may be provided by the power detecting circuit 120 of FIG. 3) may also rise to follow the increasing level of the power supply voltage VDD. Responsive to the voltage rise of the detection signal PDT, the row address buffer 130 (FIG. 1) and the column address buffer 150 may generate a row address and a column address, respectively. The row decoder 140 may select a specific row (or page) of the memory cell array 110 in response to addressing by the row address buffer 130.

When the level of the power supply voltage VDD reaches the detection voltage $V_{det}$, the voltage level of the power detection signal PDT (as provided by the power detecting circuit 120) may transition or be set to ground voltage VSS. Since the pad or pin 12 of the control circuit 170 as shown in FIG. 3 may be coupled to the ground voltage VSS, or since fuse 13 of the control circuit 170a of FIG. 4 may be cut, the control circuit 170 or 170a may generate the control signal EN of level (i.e., high level) substantially the same as the level of the power supply voltage VDD. At this time, the output of the NOR gate 26 in the read initiate circuit 180 as shown in FIG. 5 may transition to substantially the same level (i.e., high level) as that of the power supply voltage VDD. Accordingly, the output signal ΦPDT of the read initiate circuit 180 may rise to the substantially same level (i.e., high level) as that of the VDD level.

After a predetermined delay by the inverters 20, 22, and 24 in the read initiate circuit 180 as shown in FIG. 5, the output of NOR gate 26 may establish the same level (i.e., low level) as that of the ground voltage VSS. Thus, the output signal ΦPDT of the read initiate circuit 180 falls to the level of VSS. Accordingly, when the flash memory device 100 is used as a boot-up memory, the read initiate circuit 180 may output a pulse for the signal ΦPDT.

The read controller 190 (FIG. 1) may activate the page buffer 200 in response to the pulse of signal ΦPDT as provided by the read initiate circuit 180. Thus, the page buffer 200 may sense and amplify data (i.e., boot-up data) stored in the selected row and columns(s). At this time, flash memory device 100 may inform external devices (e.g., a central processing unit) of its operability by activating a ready/busy signal R/B̄. Such ready/busy signal may indicate that the memory device itself is reading-out data (i.e., that the memory device remains in a busy state). When busy, the memory may thus block the external devices from access trials.

Next, when a data sensing operation is finished, the flash memory device 100 may inform the external device of the operation conclusion by deactivating the ready/busy signal R/B̄. When this status signal has been deactivated, the memory device remains in a ready state operable to allow the external devices access thereto.

Column decoder 160 may select specific columns of the memory cell array 110 by controlling the column or Y gate circuit 210 responsive to a column address from the column address buffer 150. Then, the data (i.e., boot-up data) which is sensed may be sequentially output through the data output buffer 220. The data sequentially output may comprise bit groups corresponding to the number of pins (e.g., 8 or 16) of the data input/output. These sequential outputs may be provided when then read enable signal RE from an external device, such as a central processing unit, is activated.

Upon completion of a boot-up read-out operation for a system power-up, the flash memory device 100 may enter a ready mode. In this mode, the flash memory may perform normal write (erase and program)/read operations. If external circuits require write/read operation, the flash memory device 100 may perform an appropriate operation responsive to such requests. During such operation, in this embodiment, the boot-up data is protected. The boot-up data may be protected by inhibiting write operation into areas of the memory devoted to the boot-up data. Particularly, it will be understood that the normal write/read operations of the flash memory device 100 may be performed appropriately dependent on a chip enable signal $\overline{CE}$, a command latch enable signal CLE, an address latch enable signal ALE, a write enable signal $\overline{WE}$, a read enable signal $\overline{RE}$, and a command provided externally, for example, as shown by the representative timing diagram of FIG. 7.

In an embodiment where the flash memory device is not to be used as a boot-up memory, the pad or pin 12 of the control circuit 170 as shown in FIG. 3 is coupled to the power supply voltage VDD or, for an alternative, the fuse 13 of the control circuit 170a shown in FIG. 4 may be left intact.

Referring to FIG. 8, during a system power-on, the power supply voltage VDD starts to rise and the voltage level of the power detection signal PDT may follow the increasing level of the power supply voltage VDD. The row address buffer 130 and the column address buffer 150 (FIG. 1) may internally generate row and column addresses in response to the rise in voltage of the detection signal PDT. More specifically, the row address buffer 130 and the column address buffer 150 may be initialized to predetermined row and column addresses, respectively. The column decoder 140 may remain in a state capable of selecting a specific row (or page) of memory cell array 110 responsive to the row address from the row address buffer 130.

When the power supply voltage VDD reaches the detection voltage $V_{det}$, the PDT voltage of the power detecting circuit 120 may be set to be identical with the ground voltage VSS. Since pad 12 of control circuit 170, as shown in FIG. 3, may be coupled to ground voltage VSS, or the fuse 13 of the control circuit 170a of FIG. 4 remains intact, the control circuit 170 or 170a may generate a control signal EN of substantially same level (i.e., high level) as that of the power supply voltage VDD. Accordingly, NOR gate 26 of the read initiate circuit 180 as shown in FIG. 5 may produce an output level of substantially same level (i.e., high level) as that of the power supply VDD. However since output signal EN of the control circuit 170 or 170a may maintain substantially the same low level (i.e., ground voltage VSS), the output signal ΦPDT of the read initiate circuit 180 may remain at the substantially same level (i.e., low level) as the ground voltage VSS.

After a predetermined delay, determined by inverters 20, 22, and 24 of the read initiate circuit 180 (FIG. 5), the output of the NOR gate 26 may establish substantially the same level (i.e. low level) as the ground voltage VSS.

Read controller 190 may deactivate the page buffer 200 in response to deactivation of the output signal ΦPDT by the read initiate circuit 180. Thus, the data sense and amplify operations (i.e., boot-up data), as may be stored in rows and column(s) selected by the page buffer 200, may not be performed during a system boot-up (e.g., power-up). Accordingly, no data is transferred to the data input/output pins even though the read enable signal $\overline{RE}$ may be activated during the system boot-up. With the flash memory avoiding unnecessary operations during a system power-on duration, power may be conserved.

After conclusion of the system power-up, the flash memory may enter a ready mode, operable to perform normal write/read memory operations. In this mode, flash memory 100 may monitor activation/deactivation of the chip enable signal $\overline{CE}$, the command latch enable signal CLE, the address latch enable signal ALE, the write enable signal $\overline{WE}$, and the read enable signal $\overline{RE}$. The flash memory may thus monitor commands provided through the data input/output pins.

Figure 9:
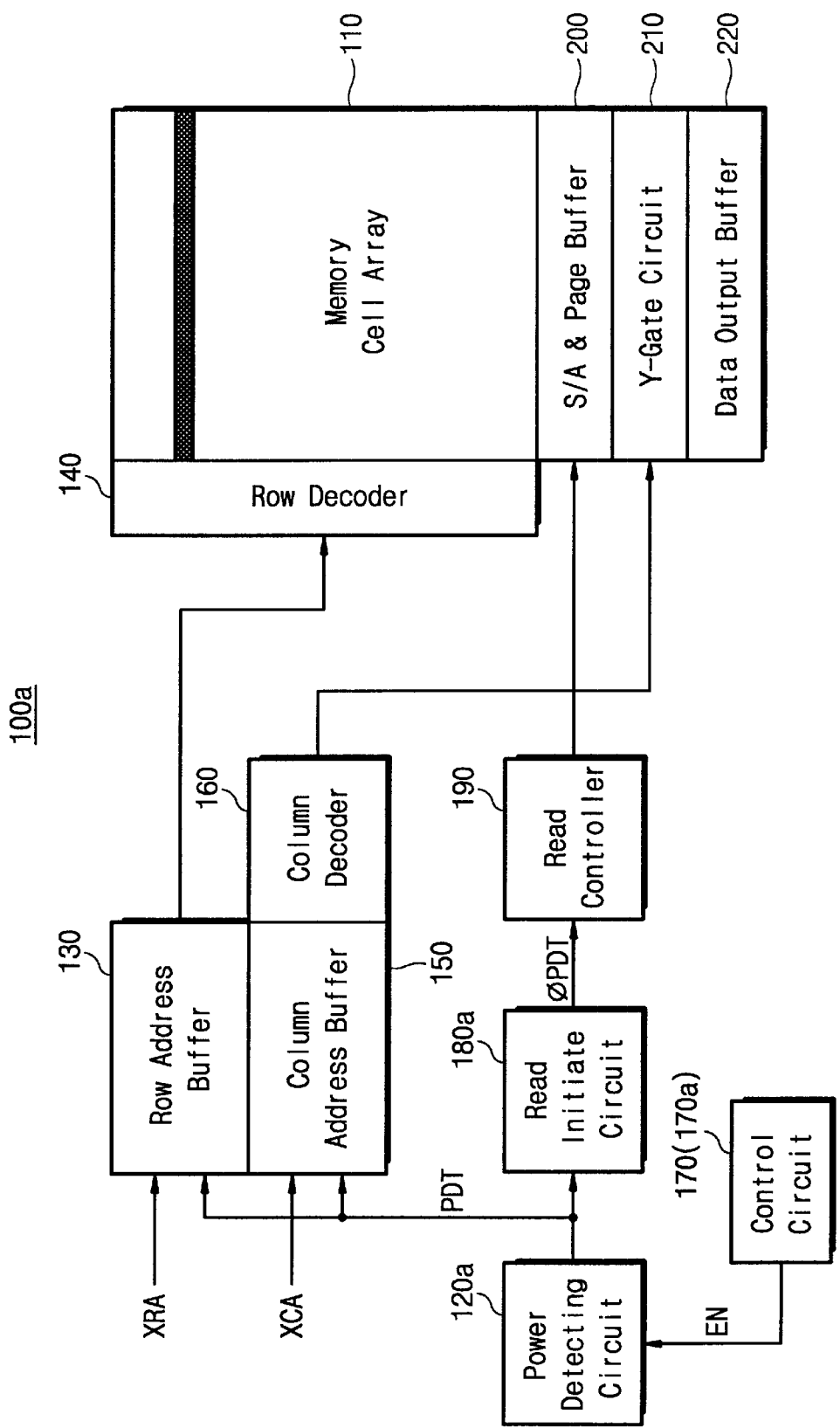
FIG. 9 is a block diagram of another embodiment of the nonvolatile flash memory device according to the present invention.

FIG. 9 illustrates another preferred embodiment of the nonvolatile flash memory device of the present invention. Flash memory device 100a, referencing FIG. 9, has the same construction as the flash memory device 100 of the example of FIG. 1, except that the control circuit 170 or 170a may control a power detecting circuit 120a. Additionally, the flash memory device 100a of FIG. 9 may operate with the same principles as the embodiment of the flash memory device 100 of FIG. 1. However, the power detecting circuit 120a and the read initiate circuit 180a for the embodiment of FIG. 9 may differ from those 120 and 180 for the embodiments of FIG. 1. Also, their operations may similarly differ.

Figure 10:
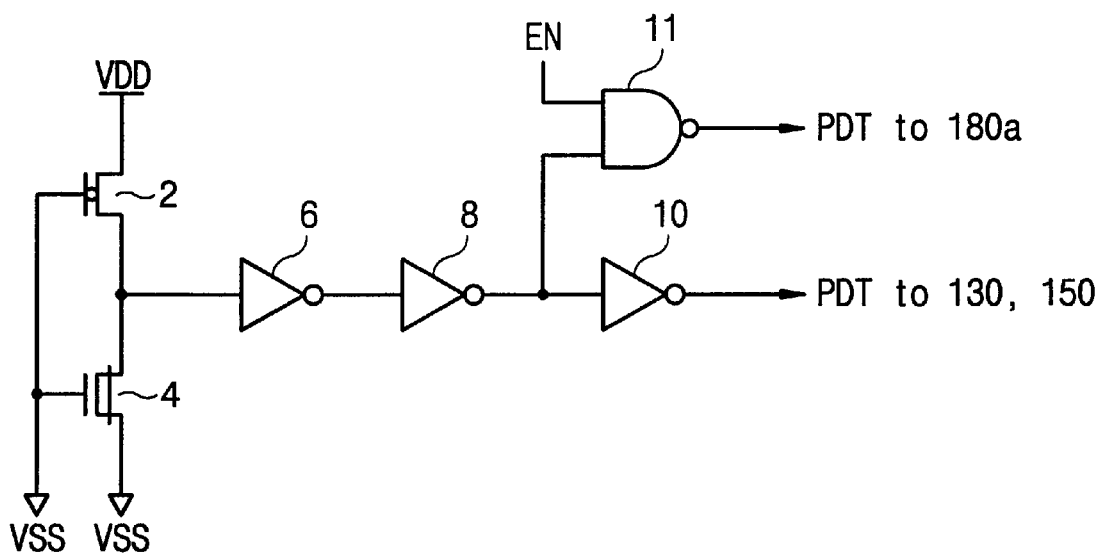
FIG. 10 is a circuit diagram of the power detecting circuit shown in FIG. 9.

FIG. 10 illustrates a circuit diagram of a power detecting circuit 120a embodiment e.g., such as that for the system of FIG. 9. The power detecting circuit 120a of this embodiment may have the same construction as that for the circuit 120 of FIG. 2, except that it may further comprise a NAND gate 11 and may generate two power detection signals. One input of NAND gate 11 may be connected between inverters 8 and 10. Control signal EN of a control circuit (e.g., 170 or 170a) may drive the other input of NAND gate 11. Output of inverter 10 may drive the row and column address buffers 130 and 150 with first power detection signal PDT. An output of the NAND gate 11, ANDed with the enable signal EN, may drive the read initiate circuit 180a as a second power detection signal PDT.

Figure 11:
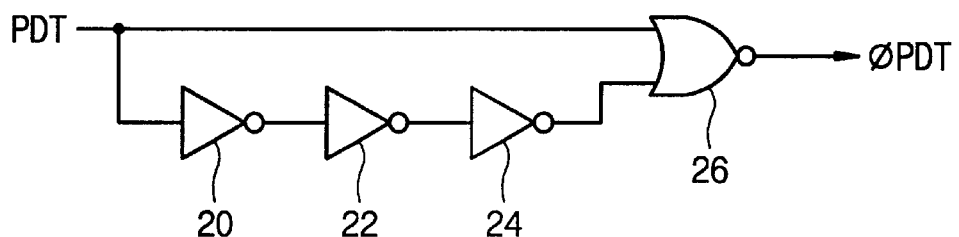
FIG. 11 is a circuit diagram of the read initiate circuit shown in FIG. 9.

FIG. 11 illustrates a read initiate circuit 180a for an embodiment of FIG. 9. The read initiate circuit 180a may comprise a short pulse generating circuit of inverters 20, 22, and 24 and NOR gate 26. NOR gate 26 receives power detection signal PDT at one input directly, and at a second input via the inverter chain 20, 22 and 24.

Returning to FIG. 10, activation of the detection signal PDT may be provided by NAND gate 11 of the read initiate circuit 180a (controlled by the control signal EN from the control circuit 170 or 170a). If the flash memory device 100a is to be set as a boot-up memory, the control signal EN may be activated high during a system power-on duration. Thus, the signal PDT output from the NAND gate 11 may fall to the lower level (low level) of ground voltage VSS upon the power supply voltage VDD reaching the detection voltage $V_{det}$. Again, the read initiate circuit 180a may generate a pulse of signal ΦPDT dependent upon transitions of the output signal PDT from the NAND gate 11. Read controller 190 may thus activate the page buffer 200 responsive to the pulse of signal ΦPDT, thereby allowing boot-up data to be read-out from the flash memory during the system power-up.

On the other hand, if flash memory device 100a is not to be set as a boot-up memory, the control signal may be deactivated (e.g., with low level) during the system power-on duration. Thus, the output signal PDT of NAND gate 11 may continuously follow levels of the power supply voltage VDD. The output signal ΦPDT from the read initiate circuit 180a may, therefore, be held at a low level throughout the system power-up. As a result, the read controller 190 may deactivate the page buffer 190 and may inhibit boot-up data from being read-out during the system power-up.

While the present invention has been described in connection with specific and preferred embodiments thereof, it is capable of various changes and modifications without departing from the spirit and scope of the invention. For example, it will be understood that alternative embodiments may comprise sub-combinations of the disclosed exemplary embodiments. It should be appreciated, therefore, that the scope of the invention is not limited to the detailed description of the invention hereinabove, which is intended merely to be illustrative, but rather comprehends the subject matter defined by the following claims.

What is claimed is:

1. A flash memory device comprising:
a plurality of nonvolatile memory cells;
a power detecting circuit to generate a first detection signal when a power supply voltage is lower than a predetermined detection voltage;
address generator to generate an address responsive to the first detection signal of the power detecting circuit;
a read circuit to read data from the plurality of nonvolatile memory cells in response to the generated address; and
a control circuit to control activation of the read circuit dependent on predetermined device information when the power supply voltage is lower than the predetermined detection voltage.

2. The flash memory device according to claim 1, in which the power detecting circuit uses an internal supply voltage of the memory device for the detection voltage, internal supply voltage being lower than the power supply voltage.

3. The flash memory device according to claim 1, in which the power detecting circuit uses as the detection voltage, a signal established with a level lower than the power supply voltage and greater than an internal supply voltage of the memory device, the internal supply voltage to be lower than the power supply voltage.

4. The flash memory device according to claim 1, in which the power detecting circuit comprises a transistor of threshold voltage to establish the detection voltage with a level lower than an internal supply voltage of the memory device, the internal supply voltage to be lower than the power supply voltage.

5. The flash memory device according to claim 1, in which the address generator includes an address buffer to store an address externally applied thereto.

6. The flash memory device according to claim 1, in which the device information is to indicate whether or not the memory device is to be used as a boot-up memory.

7. The flash memory device according to claim 1, in which the control circuit includes a programmable element to store the device information.

8. The flash memory device according to claim 7, in which the programmable element is to store device information to indicate whether or not the memory device is to be used as a boot-up memory.

9. The flash memory device according to claim 1, in which the control circuit comprises a pad formed on the memory device, the pad being electrically coupled to one of a first device setting voltage or a second device setting voltage.

10. The flash memory device according to claim 9, wherein the pad is one of pads to interface the memory device with external circuits.

11. The flash memory device according to claim 9, wherein the pad comprises a bonding pad.

12. The flash memory device according to claim 9, wherein one of the first and second device setting voltages comprises a logic zero voltage and the other, a logic one voltage.

13. The flash memory device according to claim 1, in which the control circuit includes a fuse circuit having at least one fuse, the fuse circuit to selectively provide either a first device setting voltage or a second device setting voltage dependent on a connection state of the at least one fuse.

14. The flash memory device according to claim 13, wherein one of the first and second device setting voltages is a logic zero voltage and the other is a logic one voltage.

15. A flash memory device comprising:
a memory cell array having a plurality of nonvolatile memory cells arranged in rows and columns;
a power detecting circuit to generate a first detection signal when a power supply voltage is lower than a predetermined detection voltage;
address generating means for internally generating an address in response to the first detection signal;
a read circuit to read data from the memory cell array dependent on internally generated addresses of the address generating means; and
a control circuit to generate a control signal to control the read circuit dependent on device information and whether or not the power supply voltage is lower than a predetermined detection voltage;
wherein the read circuit comprises:
a row selecting circuit to select one or more rows of the memory cell array dependent on a row address of the internally generated address;
a column selecting circuit to select one or more columns of the memory cell array dependent on a column address of the internally generated address;
a page buffer circuit to sense data from selected memory cells of the selected columns;
a read initiate circuit to generate a second detection signal when the power supply voltage reaches the predetermined detection voltage and the control signal is active; and
a read controller to control a sensing operation of the page buffer circuit responsive to the second detection signal; and
wherein the read initiate circuit is to be selectively controlled by the control signal of the control circuit based upon the device information and whether or not the power supply voltage is lower than the predetermined detection voltage.

16. The flash memory device according to claim 15, wherein the address generating means comprises an address buffer to store an address externally applied thereto.

17. The flash memory device according to claim 15, in which the control circuit comprises a storage circuit to store the device information.

18. The flash memory device according to claim 17, the control circuit to use the device information to determine whether or not the memory device is to be used as a boot-up memory.

19. The flash memory device according to claim 18, the storage circuit to include a pad formed on the memory device, the pad to be connected to one of either a first device setting voltage or a second device setting voltage.

20. The flash memory device according to claim 19, in which the pad is one of several pads operable to interface external devices.

21. The flash memory device according to claim 19, in which the pad comprises a bonding pad.

22. The flash memory device according to claim 19, in which one of the first and second device setting voltages is the power supply voltage and the other is a ground voltage.

23. The flash memory device according to claim 18, in which the storage circuit comprises a fuse circuit having at least one fuse, the fuse operable to provide the fuse circuit with one of a first device setting voltage or a second device setting voltage based on the connection state of the at least one fuse.

24. The flash memory device according to claim 23, in which one of the first and second device setting voltages is the power supply voltage and the other is a ground voltage.

25. A flash memory device comprising:
a plurality of nonvolatile memory cells arranged in rows and columns;
a detector to generate a first detection signal when a power supply voltage is lower than a predetermined threshold;
addressor to internally generate an address responsive to the first detection signal of the detector;
a read circuit to read data of the plurality of memory cells responsive to an internally generated address of the addressor; and
a controller to determine device information and to check a level of the power supply voltage;
the controller operable to control the read circuit based upon its device information determination and the supply level check; and
the power detecting circuit to be activated selectively under the control of the control circuit based upon the device information determination and the level check.

26. The flash memory device according to claim 25, in which:
the controller is operable to determine when the level of the power supply voltage drops below the predetermined threshold;
the controller is to control the read circuit dependent upon determining that the power supply voltage is below the predetermined threshold; and
the power detecting circuit to be activated selectively under the control of the control circuit based upon the device information determination and when the level of the power supply voltage is determined to be below the predetermined threshold.

27. The flash memory device according to claim 25, in which the read circuit comprises:
a row selecting circuit to select one or more rows based on a row address of an internally generated address of the addressor;
a column selecting circuit to select one or more columns based on a column address of an internally generated address of the addressor;
a page buffer circuit to sense data stored in memory cells of the selected columns;
a read initiate circuit to generate a second detection signal when the power supply voltage reaches the predetermined detection voltage and a control signal of the controller is active; and
a read controller to control a sense operation of the page buffer circuit responsive to the second detection signal of the read initiate signal.

28. The flash memory device according to claim 25, in which the addressor comprises an address buffer to store an address externally applied thereto.

29. The flash memory device according to claim 25, in which the controller comprises a storage circuit to store the device information.

30. The flash memory device according to claim 29, in which the controller is to determine whether or not to enable use of the memory device as a boot-up memory based on the device information.

31. The flash memory device according to claim 30, in which the storage circuit includes a pad of the memory device, the pad being connected to one of a first device setting voltage or a second device setting voltage.

32. The flash memory device according to claim 31, in which the pad is one of a plurality of pads to interface the memory device to external devices.

33. The flash memory device according to claim 31, in which the pad comprises a bonding pad.

34. The flash memory device according to claim 31, in which one of the first and second device setting voltages is the power supply voltage and the other is a ground voltage.

35. The flash memory device according to claim 30, in which the storage circuit comprises a fuse operable to establish the device information based on a connection state thereof.

36. A method of operating a flash memory device within a system, comprising:
determining, during a duration of the system power-up, whether the memory device is to be set as a boot-up memory of the system;
reading boot-up data stored in the memory device during the system power-up when the memory device is determined to be set as boot-up memory; and
entering, after the system power-up, a ready mode to allow normal write/read operation of the memory device when the memory device is determined not to be set as a boot-up memory.

37. The method according to claim 36, in which the determining comprises reading device information that may indicate whether or not the memory device is to be set as the boot-up memory when a power supply voltage is determined lower than a predetermined detection voltage.

38. The method according to claim 37, in which the reading boot-up data comprises:
generating an address internally when the device information indicates the memory device to be set as a boot-up memory; and
sensing the boot-up data of the memory dependent on the internally generated address when the power supply voltage reaches the predetermined detection voltage.

39. The method according to claim 38, further comprising preventing the sensing when the device information indicates the memory device is not to be set as the boot-up memory.

* * * * *